United States Patent
Greene (10) Patent No.: US 8,737,003 B2
(45) Date of Patent: May 27, 2014

(54) OFFSET-INDUCED SIGNAL CANCELLATION IN AN INTERLEAVED SAMPLING SYSTEM

(75) Inventor: Robert Alan Greene, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/586,534

(22) Filed: Aug. 15, 2012

(65) Prior Publication Data

US 2014/0049853 A1 Feb. 20, 2014

(51) Int. Cl.
*G11B 5/09* (2006.01)
*G11B 5/035* (2006.01)

(52) U.S. Cl.
USPC .............................................. 360/51; 360/65

(58) Field of Classification Search
None
See application file for complete search history.

(56) References Cited

U.S. PATENT DOCUMENTS

| | | | | |
|---|---|---|---|---|
| 6,032,171 A | * | 2/2000 | Kiriaki et al. | 708/819 |
| 6,233,598 B1 | * | 5/2001 | Kertis | 708/819 |
| 6,788,240 B2 | * | 9/2004 | Reyneri et al. | 341/159 |
| 2001/0052864 A1 | * | 12/2001 | Shimizu et al. | 341/141 |
| 2005/0134307 A1 | | 6/2005 | Stojanovic et al. | |

OTHER PUBLICATIONS

Boettcher at al:; Servo signal processing for flying height control in hard disk drives; Microsyst Teohnol (Jan. 7, 2011) 17:937-944; www.springerlink.com.
Richetta et al.; WP 5.1: A 16 MB/s PRML Read/Write Data Channel; 1995 IEEE International Solid-State Circuits Conference; 1SSCC95 1 Feb. 15, 1995 / Sunset A-D / 1:30 PM.

* cited by examiner

*Primary Examiner* — Thang Tran (57) ABSTRACT

Described embodiments provide an interleaved sampler having N sample and hold circuits for sampling an input signal, and M multiplexers. Each multiplexer is adapted to couple all N of the plurality of sample and hold circuits to a respective output of the interleaved sampler. The interleaved sampler samples at a sample rate of $f_s$, has an interleaved sampling period of $M/f_s$, where M is greater than one and less than N. Because there are more sample and hold circuits than there are samples taken during an interleaved sampling period, different combinations of the sample and hold circuits are used from interleaved sample period to interleaved sample period. This reduces spurious tones generated from offset voltages when using interleaved sample and hold circuits. The order of the sample and hold circuits are clocked might be random, pseudorandom, or a fixed pattern longer than the interleaved sampling period.

20 Claims, 7 Drawing Sheets

OFFSET-INDUCED SIGNAL CANCELLATION IN AN INTERLEAVED SAMPLING SYSTEM

BACKGROUND OF THE INVENTION

In hard-drive systems, the data is stored as magnetic flux regions or "magnets" along the surface of a rapidly spinning magnetic media or hard disk with one or more read/write heads "floating" or "flying" very near the media surface. Given the high data rates and low latency requirements of modern hard-drive read channels, data read from the hard disk is sampled using interleaved sampling techniques. The sampled data is converted by a quantizer, forming an interleaved analog-to-digital converter (ADC) and then processed digitally, or the sampled data is processed with sampled analog techniques, or a combination of both.

Controlling the position of the head along the media uses a repeating pattern of magnets. Unlike data that has a somewhat random pattern, repeating patterns (e.g., 2 T magnet length having a pattern . . . 11001100 . . . ) is readily detectable and produces "tones" or signals having a frequency corresponding to the magnet rate and harmonics thereof.

There are several sensitive measurements in modern hard-drives (for example, flying-height sensing and overwrite measurements) that relies on these repeating patterns. For some of these sensitive measurements, however, it is necessary to resolve a very low level signal in the presence of noise and other large signal interferers. Typically a discrete Fourier transform (DFT) is used to separate out the various tones and then measure the amplitudes of those tones.

For example, determining head flying-height (the height of the read head above the spinning magnetic media in a hard drive) involves the measuring the level of one or more harmonics of the fixed pattern relative to the frequency of the fixed pattern. The difference in amplitude between the frequency of the fixed pattern and the third (or higher) harmonic might be 20 dB or more. For more details on head flying height measurement, see, for example, "Servo Signal Processing for Flying Height Control in Hard Disk Drives" by Boettcher et al., Microsyst Technol (2011) 17:937-944, incorporated by reference herein in its entirety.

Another example is determining the effectiveness of overwriting existing data on a spinning magnetic media by the write head by, for example, writing a high-frequency servo pattern, e.g., a 2 T pattern, and then overwriting that pattern with a lower-frequency servo pattern, e.g., a 7 T pattern, and then measuring the level of the weak residual overwritten pattern in the presence of the large lower frequency pattern to determine the effectiveness of overwriting of the magnetic media. For more details on one example how to perform an overwrite measurement but detecting a low-frequency servo pattern overwritten by a high-frequency pattern, see page 8 of an application note from Tektronix titled "Measurement Solutions for Disk Drive", document 55 W__17699__1, 2006 and 2009, incorporated by reference herein in its entirety. As in the case for head flying height control, the level of the overwritten pattern in the read signal may be 20 or more dB below that of the higher frequency pattern.

Because the desired signal may be "buried under" other signals and noise, a highly linear sampling system is needed that does not introduce tones or other noise not associated with the desired signals.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide an interleaved sampler comprising a number of sample and hold circuits for sampling an input signal, and at least one multiplexer. The at least one multiplexer is adapted to couple all of the plurality of sample and hold circuits to an output of the interleaved sampler one at a time. The interleaved sampler is adapted to sample at a sample rate of $f_s$, has an interleaved sampling period of M/fs, where M is an integer greater than one and less than the number of the sample and hold circuits.

BRIEF DESCRIPTION OF THE DRAWINGS

Other embodiments of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation".

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

Also for purposes of this description, the terms "couple", "coupling", "coupled", "connect", "connecting", or "connected" refer to any manner known in the art or later developed in which energy is allowed to be transferred between two or more elements, and the interposition of one or more additional elements is contemplated, although not required. Conversely, the terms "directly coupled", "directly connected", etc., imply the absence of such additional elements.

Signals and corresponding nodes or ports might be referred to by the same name and are interchangeable for purposes here. The term "or" should be interpreted as inclusive unless stated otherwise.

Moreover, the terms "system," "component," "module," "interface," "model," or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

The present invention will be described herein in the context of illustrative embodiments of an interleaved sampler system adapted to be for use in a hard-disk drive or the like. It is to be appreciated, however, that the invention is not limited to the specific apparatus and methods illustratively shown and described herein. Rather, aspects of the invention are directed broadly to techniques for beneficially providing an interleaved sampler system with more sample and hold circuits than there are samples taken during an interleaved sampling period so that different combinations of the sample and hold circuits are used from interleaved sample period to interleaved sample period.

For purposes of this description, a change in the magnetic flux on the surface of the magnetic media is a reversal in magnetic polarity from N to S or vice-versa. While magnetic resistive (MR) heads in hard drive systems detect the polarity of a magnetic flux, it is generally the case that a change in the magnetic flux polarity indicates a change in the data value, e.g., a "1" to a "0" or vice-versa, while no change in the polarity indicates no change in data value. When reading from the disk, the "magnet length" is defined by the sampling period of the samplers, i.e., because the data read from the magnetic media by the MR head is sampled using one or more samplers at a sample rate ($f_s$) approximately equal to or greater than the data rate of data read by the read head, one magnet length is equal to the total time or number of sample intervals that the sample (or flux) has the same value. For example, if the interval between flux reversals spans two samples, then the magnet length is two sample periods. In another example, a repeating 2 T pattern (1, 1, 0, 0) is written to the media at a one (1) gigahertz (GHz) rate and then the written 2 T pattern is read and sampled at a 2 GHz rate. In this example, the samples are 1, 1, 1, 1, 0, 0, 0, 0, so that the magnet length is four sample periods at the 2 GHz rate for a total time of 2 ns.

For interleaved samplers, there are N samplers, each sampler strobed or enabled to sample incoming data at the $f_s/N$ and the outputs of the samplers summed, optionally with the samples weighted or scaled prior to summing, to produce a composite signal. The interleaved sampling allows for a higher effective sampling rate and low latency compared to non-interleaved samplers that advantageously allows for relaxed filter constraints in the read channel.

Figure 1:
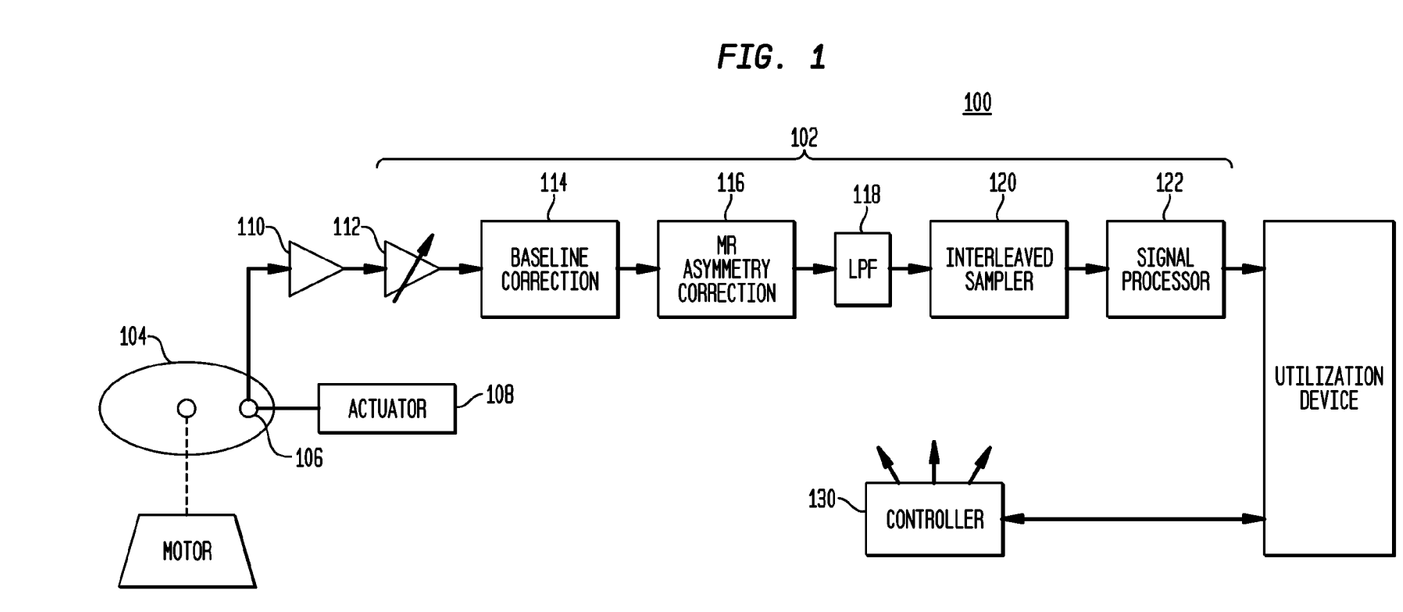
FIG. 1 is a simplified block diagram illustrating an exemplary read channel according to an embodiment of the invention.

In FIG. 1, a generalized block diagram of an exemplary mass storage (magnetic) hard-drive system 100 having a read channel 102 with one or more analog-to-digital converters. Operation of the hard drive system 100 is well known and is not discussed in detail here. Briefly, a system 100 typically has a motor (not numbered) driving a magnetic media 104, such as a magnetizable disk. User data and servo data stored on the disk 104 is read by a head 106, such as a magnetoresistive (MR) head, positioned by an actuator 108. Signals from the head 106 are first amplified by a preamplifier 110, typically located in proximity to the head 106, and further amplified by a variable gain amplifier (VGA) 112. The amplified signals from VGA 112 are processed by a base-line correction circuit that adjusts the balance of the differential signal to compensate for the drift in the average level of the incoming differential signal.

Because, in this embodiment, the head 106 is an MR head that has a non-linear response to magnetic fields (see, for example, U.S. Pat. No. 5,744,993, by J. L. Sonntag, incorporated by reference herein in its entirety, regarding an exemplary MR asymmetry and correction circuitry), asymmetry in the corrected signals are compensated by circuit 116. The compensated signals from circuit 116 are filtered by anti-aliasing low-pass filter 118. The low-pass filtered signals are sampled by interleaved sampler 120 and the sampled signals are processed by signal processor 122 for consumption by a utilization device (not numbered) such as a computer.

The blocks 110-122 are used in the embodiment to process both user data and servo data. Alternatively, separate user data and servo data paths may be provided with blocks 110-122 in common with both paths.

A controller 130 is typically a dedicated microprocessor or digital signal processor (DSP), coupled to the utilization device (computer, etc.), used to control the detailed operation of the mass storage system 100. One function of the controller is to move the head 106 using the actuator 108 to the track on the media 104 requested by the utilization device and "fine-tuning" the head position by using servo channel data on the media 104 as feedback. Another function of the controller 130 is the adjustment of various circuit functions of blocks 110-122 depending on the track being read/written on the media 104 and whether user data, servo data, or other data is being read by the head 106.

As is understood in the art, the signal processor 122, such as a digital signal processor or a configurable logic circuit and under control by the controller 130, processes the sampled signals to extract user data therefrom, detect and process servo data for the controller 130, or, as will be explained in more detail below and in one embodiment, implement a discrete Fourier transform (DFT) to detect certain recorded signals stored on the media 104.

Figure 2:
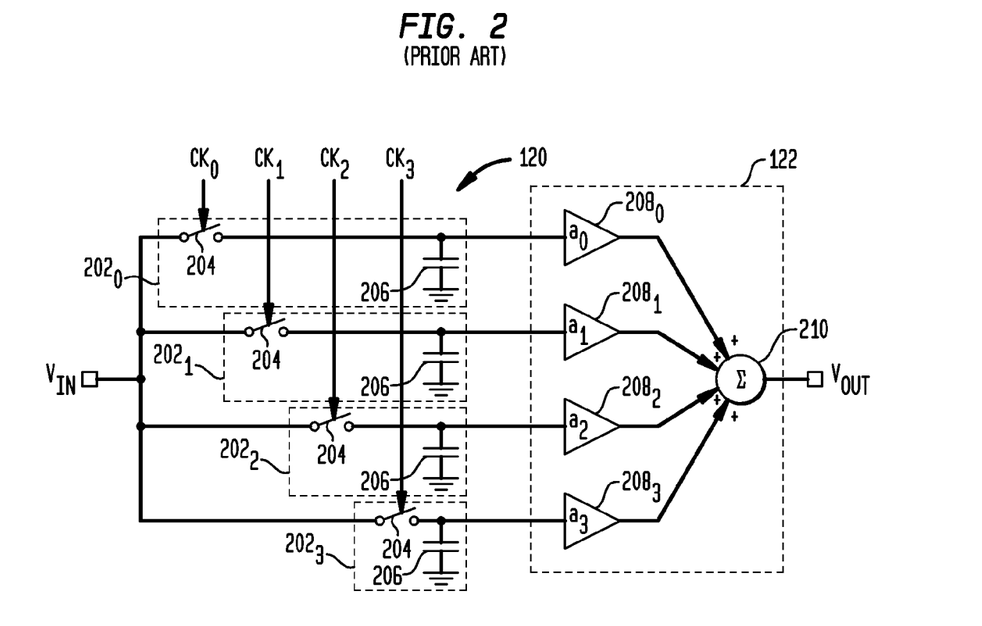
FIG. 2 is a simplified diagram of a conventional interleaved sampler.

FIG. 2 illustrates a conventional interleaved sampler 120, having four sample and hold (S/H) circuits $202_0$-$202_3$, and conjoined signal processor 122. Each S/H circuit $202_0$-$202_3$ has a switch 204, responsive to a corresponding sample signal $CK_0$-$CK_3$, and a storage capacitor 206. Voltage on the storage capacitor 206 follows or tracks the input signal on input $V_{IN}$ while the corresponding switch 204 is closed.

The signal processor 122 processes samples stored by capacitors 206 using weighted or scaled by amplifiers $208_0$-$208_3$, each having a corresponding voltage gain (weight) $A_0$-$A_3$, and the scaled samples are summed by analog summer 210 to form output $V_{OUT}$. The weights $A_0$-$A_3$ may be set by the controller 130 (FIG. 1) to provide a finite-impulse response (FIR) filter response or may be changed with each sample to provide, for example, a DFT or correlator function for signal, such as a tone, detection.

Sampling by interleaved sampler 120 uses multiple S/H circuits $202_0$-$202_3$ that are staggered in time so that the signal on input $V_{IN}$ is sampled faster, here four times faster, than one sampler can do singly. Each S/H circuit $202_0$-$202_3$ requires enough time to sample the signal on input $V_{IN}$, the sampled signal to settle to a stable value on corresponding capacitor 206, and allow the corresponding one of the amplifiers $208_0$-$208_3$ and summer 210 to also settle. This sets a minimum time between samples taken by a S/H circuit so that the S/H circuits operate properly and concurrently sets the maximum rate each S/H circuit is clocked.

The sampling rate of the input signal by the interleaved sampler 120 is $f_s$ but because the four S/H are sequentially clocked every four samples to form a "interleaved sample period", each S/H is clocked at an effective rate of $f_s/4$ so that the interleaved sample period is $4/f_s$. For an interleaved sampler having N S/H circuits, each S/H circuit is clocked at a rate of $f_s/N$.

Assuming that the S/H circuits are not clocked at a rate faster than required to provide the minimum time for the S/H circuits $202_0$-$202_3$ to operate, the sampling rate of the interleaved sampler is the rate the S/H circuits $202_0$-$202_3$ are clocked multiplied by the number of S/H circuits. Generally and for fastest operation, the interleaved sample period (here $4/f_s$ for four S/H circuits 202 and $N/f_s$ for N S/H circuits 202) is approximately equal to the minimum time for the S/H circuits to operate. For example, if the minimum time is 10 ns and there are four S/H circuits, then the interleave sample period is set to 10 ns and the resulting sampling rate of the interleaved sampler is 400 M samples/second and $f_s$ equals 400 MHz.

Figure 3:
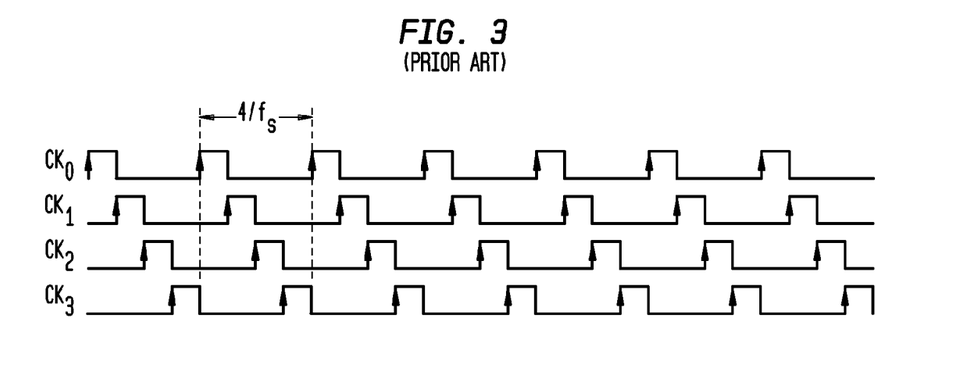
FIG. 3 is a timing diagram of operation of the interleaved sampler of FIG. 2.

FIG. 3 showing an exemplary timing diagram of the sample clock signals $CK_0$-$CK_3$ used to control switches 204 in corresponding S/H circuit $202_0$-$202_3$. As shown here, each time a sample clock signal $CK_0$-$CK_3$ goes high as illustrated by the upward arrow, the corresponding S/H circuit $202_0$-$202_3$ is clocked. While a sample clock signal is high, the switch 204 in the corresponding S/H circuit $202_0$-$202_3$ is closed to couple the signal on input $V_{IN}$ to the corresponding storage capacitor 206. When the sample signal goes low again, the input and storage capacitor are decoupled and the storage capacitor stores or holds the sampled input signal.

Figure 4:
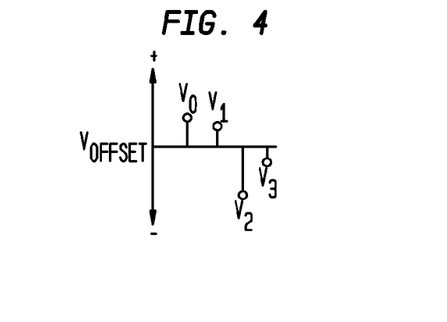
FIG. 4 is a simplified diagram of an exemplary set of sampler offsets.
Figure 5:
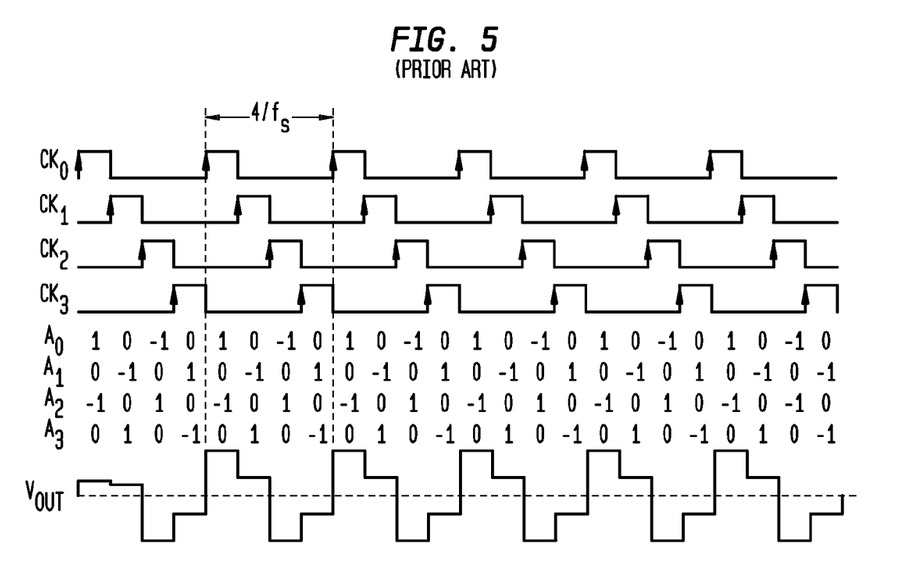
FIG. 5 is a timing diagram illustrating the effects of the sampler offsets of FIG. 4 on the operation of the interleaved sampler of FIG. 2.

The S/H circuits $202_0$-$202_3$ should be carefully designed to ensure that the output voltage mismatches or offsets between the samplers are reduced sufficiently to avoid introducing an undesired signal in the output $V_{OUT}$ as illustrated in FIGS. 4 and 5. In FIG. 4, $V_0$-$V_3$ represent an exemplary offset of the corresponding S/H circuits $208_0$-$208_3$ of FIG. 2 and ignores any offset of the amplifiers $208_0$-$208_3$. Here, S/H circuits $202_0$ and $202_1$ have positive offset voltages, and S/H circuits $202_2$ and $202_3$ have negative offset voltages. FIG. 5, a timing diagram similar to that shown in FIG. 3, illustrates the effect of unequal sampler offset voltages in the output, $V_{OUT}$, of the summer 210. In this example, the weights $A_0$-$A_3$ are adjusted with each sample of the input signal and at a rate $f_s$, here the weights having a pattern (1, 0, −1, 0) that is shifted from amplifier to amplifier. This weight pattern is part of an exemplary DFT for detecting a signal having a frequency of $f_s/4$, such as what would be generated by reading a repeating 2 T pattern as discussed above.

To determine the effect of the offsets in FIG. 4, the input $V_{IN}$ is grounded, i.e., the input signal is removed and the interleaved sampler 120 is operated. The result is an offset-induced cyclical pattern shown in FIG. 5 as $V_{OUT}$. This cyclical pattern has a fundamental frequency of $f_s/4$, the same frequency as the signal being sought, and might obscure the desired signal.

In ordinary operation, the offset-induced signal in an interleaved sampler is significantly smaller than the user data being read and consequently has little or no impact on reading essentially random data. However, in certain applications, the offset-induced signal can significantly degrade measurement sensitivity. For example, depending on the implementation of the S/H circuits $202_0$-$202_3$ and the system 100 incorporating them, mismatch between the multiple S/H circuits $202_0$-$202_3$ might result in an offset-induced signal that comprises a tone and one or more harmonics, any of which may interfere with the measurement of low-level signals related to the head flying height or overwrite measurements discussed above.

The typical approach to minimizing this signal has been primarily through attempting to reduce the sampler offset itself through calibration of offset cancellation circuitry. For the calibration to be effective, though, the resolution must be very fine, and the complexity of the calibration circuitry and algorithm add area overhead and make verification nearly impossible. Moreover, the offset cancellation is applied on a per-sampler basis, is area and power intensive, and requires periodic calibration during which time the S/H circuitry is not operational.

Figure 6:
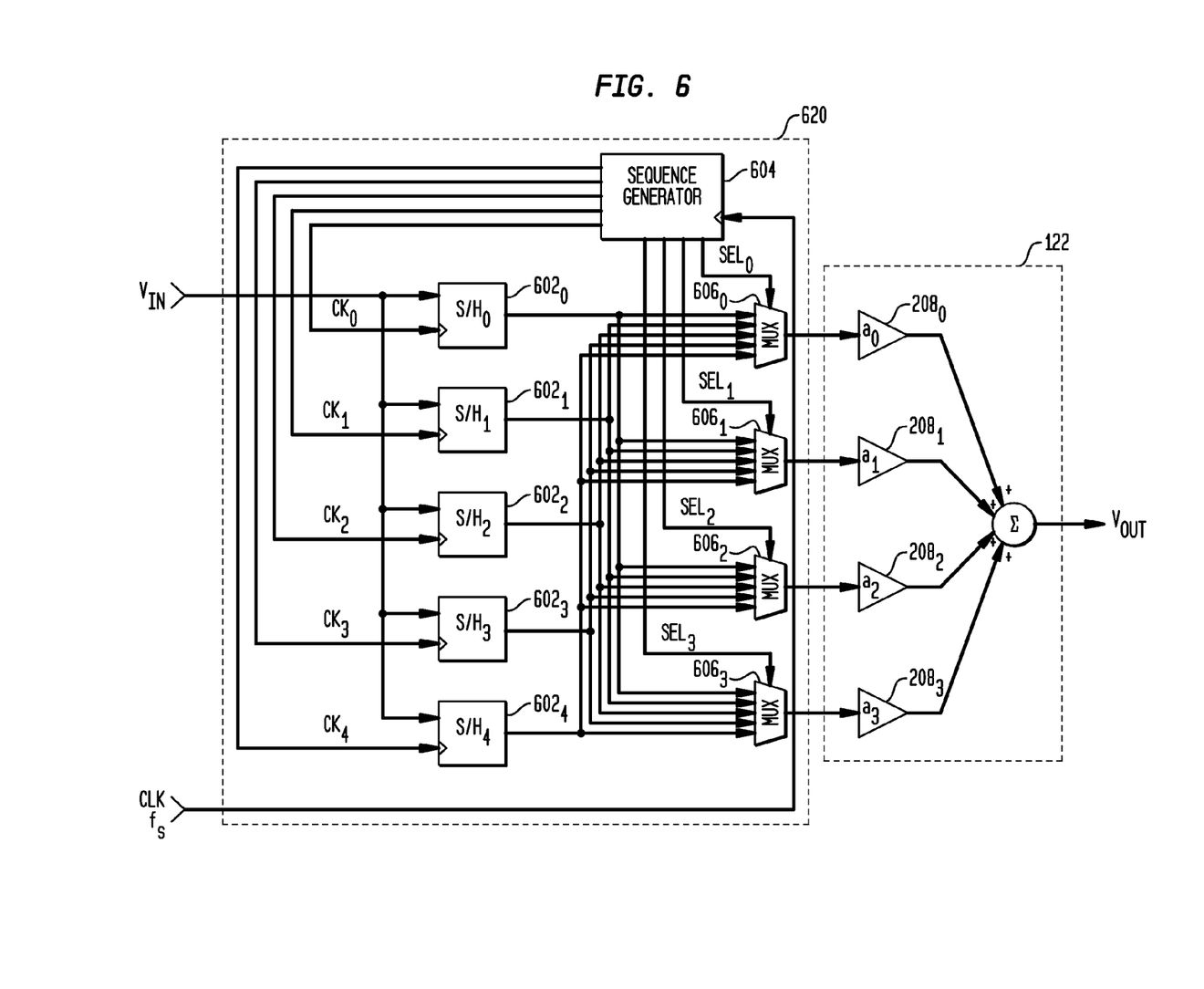
FIG. 6 is a simplified diagram of an interleaved sampler according to one embodiment of the invention.

In accordance with one embodiment of the invention, an interleaved sampler 620 and a conjoined signal processor 122, similar to signal processor 122 in FIG. 2, is illustrated in FIG. 6. In this embodiment, five sample and hold circuits (S/H) $602_0$-$602_4$, each similar to the S/H circuits $202_0$-$202_3$ in FIG. 2 are provided. A sequence generator 604 controls the clocking of each S/H circuit as will be discussed in detail in connection with FIG. 7. Outputs of the samplers are passed to multiplexers $606_0$-$606_3$, also under control of the generator 604, to couple one sampler at a time to the weighted amplifiers $208_0$-$208_3$ in the signal processor 122. The additional S/H, e.g., S/H $602_4$, is used as a substitute for various ones of the other S/H circuits $602_0$-$602_3$ either randomly or pseudo-randomly (e.g., using an algorithm with a sufficiently long period before repeating) to essentially break-up or suppress the generation of the tones described above in connection with FIG. 3. This technique essentially spreads the frequency of signals generated by the interleaved sampler and signal processor, as a result of the S/H circuit offsets, to the point that the energy of signals at a certain frequency (e.g., $f_s/4$) in the output signal $V_{OUT}$ is sufficiently reduced so as to not mask the signals to be detected. However, for applications where the tone being detected is sufficiently different from $f_s/N$ (or a harmonic thereof) where N is the number of S/H circuits, then the sequence of the S/H circuits being clocked may be in a fixed, short pattern, e.g., [0, 1, 2, 3, 4, 0, 1, 2, 3, 4, 0, . . . ] that is longer than the interleaved sampling period.

The sequence generator 604 might be programmable and controlled by controller 130 (FIG. 1) to allow for the reconfiguration of the number of the S/H circuits being used as well as the order in which the S/H circuits are clocked. This flexibility might be used where interleaved sampler 120 and signal processor 122 are used for various, possibly disparate, applications such as head flying-height measurements or detecting user data.

Figure 7:
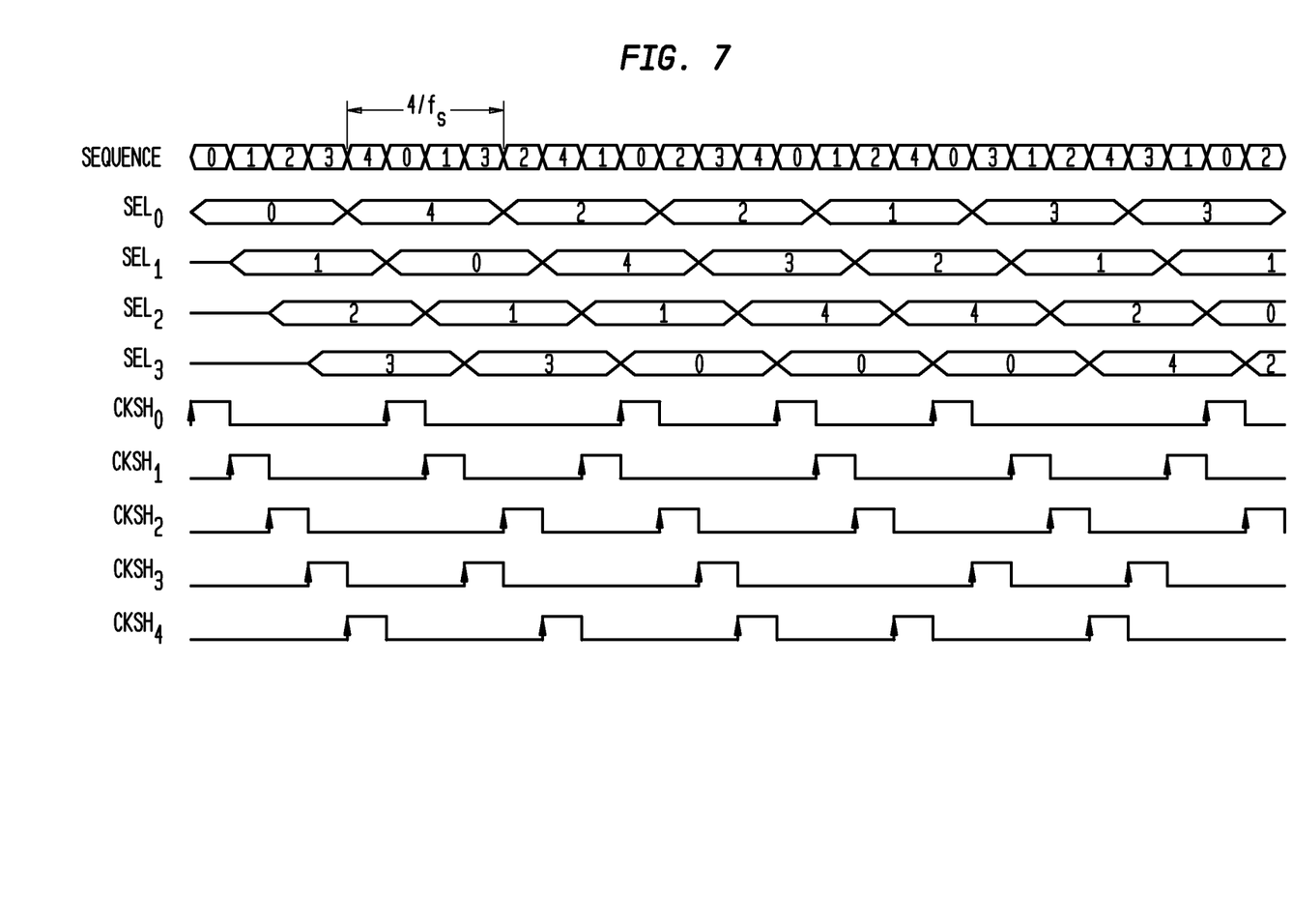
FIG. 7 is an exemplary timing diagram illustrating an exemplary operation of the interleaved sampler of FIG. 6.

An exemplary operation of the interleaved sampler is illustrated in FIG. 7. In response to the clock signal CLK having a frequency of $f_s$, the sequence generator 604 generates the sampling clock signals $CK_0$-$CK_4$ that controls the corresponding S/H circuit $602_0$-$602_4$, and the selection signals $SEL_0$-$SEL_3$ that controls the configuration of the corresponding multiplexers $606_0$-$606_3$. In this example, the sequence number refers to which S/H circuit $602_0$-$602_4$ is sampling the input signal on input $V_{IN}$. In essence, one of the multiplexers $606_0$-$606_3$ at a time is configured to couple the one S/H that is sampling the input signal at that time to one of the amplifiers $208_0$-$208_3$ in the signal processor 122. If, for example, S/H circuit $602_1$ is being clocked, then one of the multiplexer, e.g., $602_2$, is enabled to couple S/H $602_1$ to amplifier $208_2$. It is understood that the multiplexers do not have to be configured in coincidence with the clocking of an S/H.

For each sample interleave period of $4/f_s$, the sequence is this example is [0, 1, 2, 3], [4, 0, 1, 3], [2, 4, 1, 0], etc. There are 120 (5!/(5-4)!) permutations of the S/H circuits and multiplexers for a sample interleave period but not all sequences can be used in order. If, for example, a S/H sequence is [1, 2, 3, 4], then one immediately subsequent sequence that is satisfactory is [0, 2, 1, 3]. However the sequence [4, 0, 1, 3] following the [1, 2, 3, 4] sequence is not satisfactory since S/H circuit $602_4$ is being clocked again too soon, here before the sample interleave period of $4/f_s$ has elapsed for S/H circuit $602_4$. Any combination of sampling sequences formed from the sequences can be used so long as that sequence avoids clocking any of the S/H circuits sooner than the minimum cycle time of the S/H circuits, here $4/f_s$. Generally, the longer the sample sequence is before it repeats and the more random the sequence, the better the suppression of tones at $f_s/4$. Preferably, the length (K) of the sequence is greater than 20, i.e., K>20, and the sampler repetition period is then $K/f_s$.

The exemplary embodiment has five S/H circuits $602_0$-$602_4$, and four multiplexers $606_0$-$606_3$ coupled to corresponding amplifiers $208_0$-$208_3$, but it is understood that it is desirable that there are more sample and hold circuits than multiplexers/amplifiers, e.g., three S/H and two multiplexers/amplifiers, fifteen S/H circuits and twelve multiplexers/amplifiers, etc. However, for applications where a specific tone frequency is to be detected, expressed here as a fraction of the sampling frequency $f_s$, the number of sample and hold circuits should not equal the denominator of that fraction. For example, if the tone to be detected is $Pf_s/Q$, where P and Q are integers with no common factors (i.e., the fraction P/Q is irreducible) and Q>P, the number of sample and hold (S/H) circuits 602 should not be equal to Q and preferably not equal a multiple of Q. Thus, for detecting a tone of $f_s/4$, the number of S/H circuits should not equal four, and preferably not eight, twelve, etc.

Figure 8:
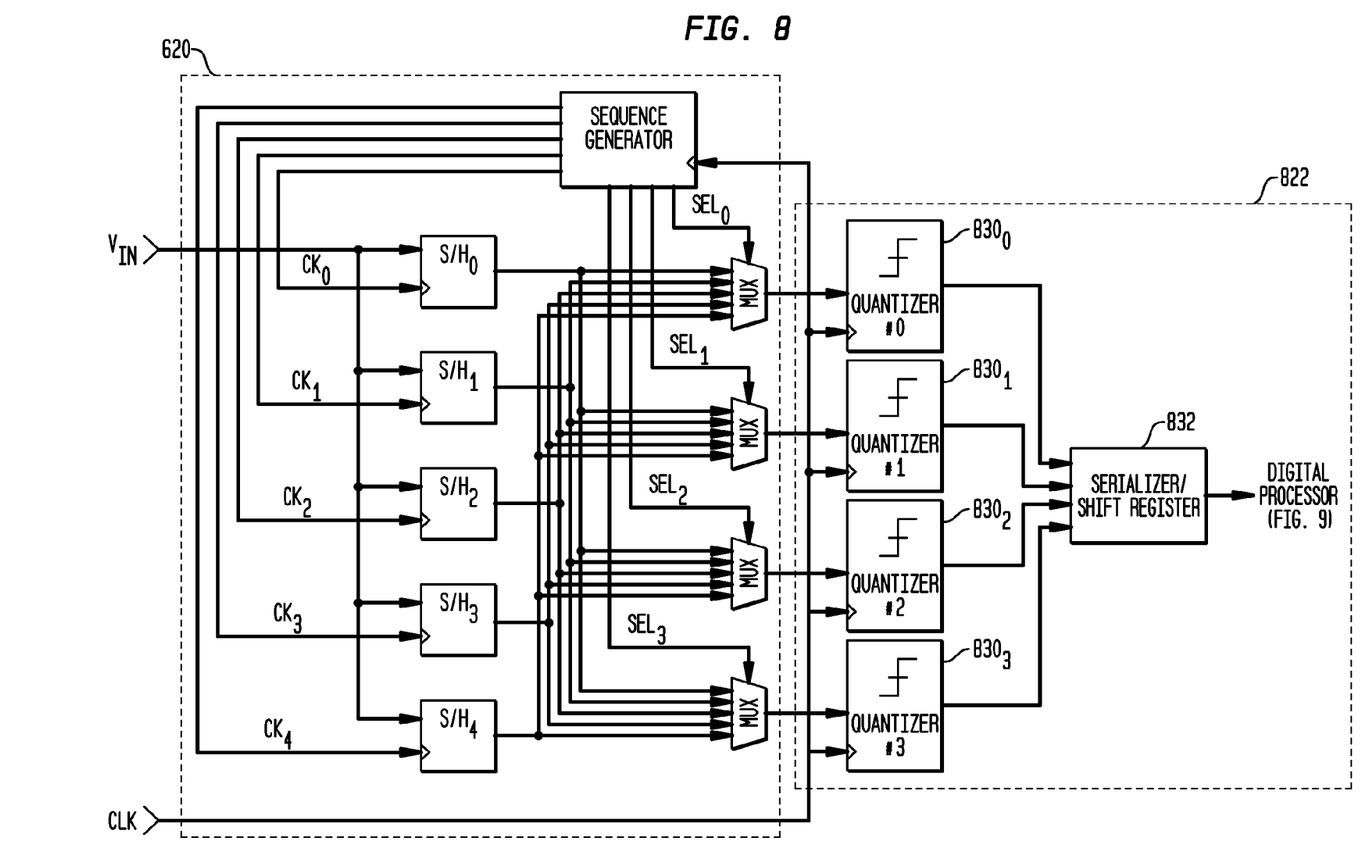
FIGS. 8 and 9 is a simplified diagram of an interleaved sampler according to another embodiment of the invention.
Figure 9:
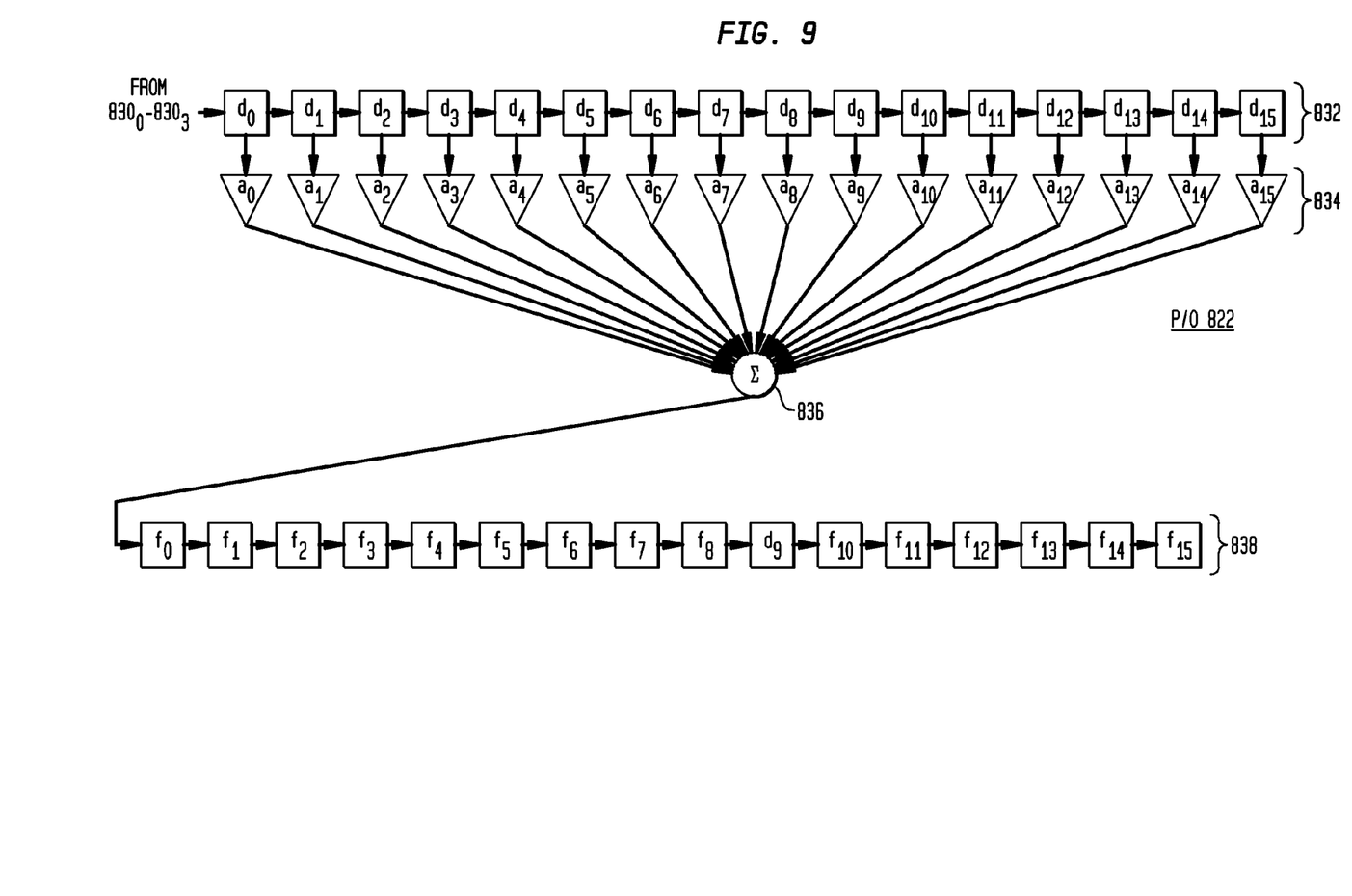

In FIGS. 8 and 9 a digital signal processor 722 replaces the analog processor 122 in FIGS. 2 and 6. The processor digitizes the four analog signals from the interleaved sampler 620, described above in connection with FIGS. 6 and 7, using one or more bit quantizers $830_0$-$830_3$. The outputs of the quantizers are fed, in this embodiment, to a shift register 832 for serializing and further processing as shown in FIG. 9. Here, the serialized data is shifted through the shift register 832, the digitized data provided at various taps along the shift register are weighted by scalars (multipliers) 834, and the results summed by adder 336. The summed, weighted data is shifted along sifter register 838. In this embodiment, the circuitry in FIG. 9 implements a DFT for detecting a tone of $f_s/16$. The shift registers 832 and 838 are sixteen taps long. By using weight values $$A_N = \sin\left(\frac{2\pi N}{16}\right),$$

where N is 0, 1, . . . , 15, the shift register 838 has the results of the DFT with sixteen output phases. It is understood in the art that other embodiments, such as a DFT for $f_s/4$, $f_s/5$, etc., or a digital filter can be implemented by suitably configuring the circuitry shown in FIG. 9 by, for example, the controller 130 (FIG. 1), although this circuitry can be implemented in dedicated hardware. Further, the number of quantizers 830 can be increased to allow for the detection of tones such as $f_s/5$, etc.

Other possible uses for the interleaved sampler include video sampling, instrumentation, or other applications where very high-speed sampling or analog-to-digital conversion is desired.

It is understood that various changes in the details, materials, and arrangements of the parts which have been described and illustrated in order to explain the nature of this invention might be made by those skilled in the art without departing from the scope of the invention as expressed in the following claims.

I claim:

1. An interleaved sampler comprising:
   a plurality of sample and hold circuits for sampling an input signal;
   at least one multiplexer configured to couple all of the plurality of sample and hold circuits to an output of the multiplexer one at a time; and
   at least one quantizer having an input coupled to the output of a corresponding multiplexer;
   wherein the interleaved sampler is configured to sample at a sample rate of $f_s$, has an interleaved sample period of $M/f_s$, where M is an integer greater than one and less than the number of the sample and hold circuits.

2. The interleaved sampler of claim 1 wherein the interleaved sampler is configured to sample at the rate $f_s$ the input signal having a frequency of $Pf_s/Q$, there are N sample and hold circuits, N≠Q, Q>P, Q and P have no common factors, and N, P, and Q are integers.

3. The interleaved sampler of claim 2 wherein N is not a multiple of Q.

4. The interleaved sampler of claim 1 further comprising a sequence generator responsive to a clock signal, wherein the sample and hold circuits sample the input signal in response to the sequence generator and the at least one multiplexer is configured in response to the sequence generator.

5. The interleaved sampler of claim 4 wherein the sequence generator is configured to configure the at least one multiplexer and clock the sample and hold circuits at approximately the same time.

6. The interleaved sampler of claim 4 wherein the sequence generator is configured to determine, on a random or pseudorandom basis, an order in which the sample and hold circuits are clocked and the at least one multiplexer is configured.

7. The interleaved sampler of claim 4 wherein the sequence generator is configured to follow a fixed repeating pattern, longer than the interleaved sampling period, in which the sample and hold circuits are clocked and the at least one multiplexer is configured.

8. The interleaved sampler of claim 1 further comprising:
   one or more weighting circuits, each of which has an output and an input, the input coupled to an output of a corresponding quantizer; and
   a summer coupled to the outputs of the one or more weighting circuits.

9. The interleaved sampler of claim 8 further comprising a controller, the controller configured to set the weight of the one or more weighting circuits.

10. The interleaved sampler of claim 8 wherein the weighting circuits and summer are configured to provide a discrete Fourier transform.

11. The interleaved sampler of claim 1 wherein there are M multiplexers having N inputs, and N sample and hold circuits.

12. The interleaved sampler of claim 11 wherein there is one additional sample and hold circuit than there are multiplexers (N=M+1), the additional sample and hold circuit is substituted for different ones of the N sample and hold circuits on a random or pseudorandom basis.

13. The interleaved sampler of claim 12 wherein the at least one multiplexer is configured to couple the additional sample and hold circuit instead of the substituted sample and hold circuit to the output of the multiplexer.

14. A hard-disk system comprising:
a rotating magnetic storage media;
a head for reading and writing data on the media; and
a sampling circuit in accordance with claim 1.

15. An interleaved sampler comprising:
a sequence generator responsive to a clock signal;
a plurality of sample and hold circuits for sampling an input signal in response to the sequence generator;
at least one multiplexer configured to couple all of the plurality of sample and hold circuits to an output of the multiplexer one at a time in response to the sequence generator;
at least one weighting circuit having an input coupled to the output of a corresponding multiplexer; and
a summer coupled to an output of the at least one weighting circuit;
wherein the sequence generator is configured to configure the at least one multiplexer and clock the sample and hold circuits at approximately the same time, the interleaved sampler is configured to sample at a rate $f_s$ the input signal having a frequency of $Pf_s/Q$, there are N sample and hold circuits, N≠Q, Q>P, Q and P have no common factors, N is not a multiple of Q, and N, P, and Q are integers; and
wherein the at least one weighting circuit and summer are configured to provide a discrete Fourier transform.

16. The interleaved sampler of claim 15 wherein the sequence generator is configured to determine, on a random or pseudorandom basis, an order in which the sample and hold circuits are clocked and the at least one multiplexer is configured.

17. The interleaved sampler of claim 15 wherein the sequence generator is configured to follow a fixed repeating pattern, longer than the interleaved sampling period, in which the sample and hold circuits are clocked and the at least one multiplexer is configured.

18. In an interleaved sampler having N sample and hold circuits for sampling an input signal at a rate of $f_s$ with an interleaved sampling period of $M/f_s$, and at least one multiplexer configured to couple all of the N sample and hold circuits to an output of the multiplexer one at a time, a method for sampling an input signal comprising the steps of:
selecting, on a random or pseudorandom basis, one of the N sample and hold circuits to sample the input signal;
configuring the at least one multiplexer to couple to the output thereof the selected sample and hold circuit; and
clocking the selected sample and hold circuit to sample the input signal;
wherein M and N are integers, M is greater than one, there is at least one additional sample and hold circuit (N−M≥1), and the method further comprising the step of substituting the at least one additional sample and hold circuit for a different one of the N sample and hold circuits on a random or pseudorandom basis.

19. The method of claim 18 wherein the interleaved sampler is configured to sample at the rate $f_s$ the input signal having a frequency of $Pf_s/Q$, N≠Q, Q>P, Q and P have no common factors, and N, P, and Q are integers.

20. The method of claim 18 wherein there are M multiplexers, each multiplexer having N inputs.

* * * * *